(12) United States Patent
Cho

(10) Patent No.: US 11,991,834 B2
(45) Date of Patent: May 21, 2024

(54) PRESSING METHOD OF A FLEXIBLE PRINTED CIRCUIT BOARD AND A SUBSTRATE

(71) Applicant: SAMSUNG DISPLAY CO., LTD., Yongin-si (KR)

(72) Inventor: Jae Uk Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 252 days.

(21) Appl. No.: 17/079,900

(22) Filed: Oct. 26, 2020

(65) Prior Publication Data

US 2021/0045253 A1 Feb. 11, 2021

Related U.S. Application Data

(62) Division of application No. 15/688,381, filed on Aug. 28, 2017, now Pat. No. 10,849,237.

(30) Foreign Application Priority Data

Oct. 28, 2016 (KR) ........................ 10-2016-0142265

(51) Int. Cl.
H05K 3/32 (2006.01)
B21J 9/02 (2006.01)
B21J 9/08 (2006.01)
H05K 1/18 (2006.01)

(52) U.S. Cl.
CPC ............. *H05K 3/325* (2013.01); *B21J 9/022* (2013.01); *B21J 9/08* (2013.01); *H05K 1/189* (2013.01); *H05K 3/32* (2013.01); *H05K 2201/10128* (2013.01); *H05K 2201/10598* (2013.01); *H05K 2203/0278* (2013.01); *H05K 2203/1105* (2013.01)

(58) Field of Classification Search
CPC .. B21J 9/022; B21J 9/08; H05K 1/189; H05K 2201/10128; H05K 2201/10598; H05K 2203/0278; H05K 2203/1105; H05K 3/32; H05K 3/325
See application file for complete search history.

(56) References Cited

U.S. PATENT DOCUMENTS

| 5,838,412 | A | 11/1998 | Ueda et al. | |
| 6,981,317 | B1* | 1/2006 | Nishida | H01L 21/563 257/E21.511 |
| 10,165,715 | B2 | 12/2018 | Choi et al. | |
| 10,849,237 | B2* | 11/2020 | Cho | B21J 9/022 |
| 2009/0250250 | A1* | 10/2009 | Ishii | H05K 1/147 174/254 |

(Continued)

FOREIGN PATENT DOCUMENTS

JP 2013-165183 A 8/2013

*Primary Examiner* — Minh N Trinh
(74) *Attorney, Agent, or Firm* — Lewis Roca Rothgerber Christie LLP

(57) ABSTRACT

A pressing method operatively associated with a press apparatus includes: providing a first substrate connected with a flexible printed circuit board onto a stage; providing a second substrate onto the stage; arranging the flexible printed circuit board on the second substrate; pressing a pad electrode-free area of the flexible printed circuit board; and pressing first pad electrodes of the flexible printed circuit board and second pad electrodes of the second substrate.

6 Claims, 12 Drawing Sheets

(56) References Cited

U.S. PATENT DOCUMENTS

| | | | |
|---|---|---|---|
| 2011/0261310 A1* | 10/2011 | Kojima | G02F 1/133308 |
| | | | 349/151 |
| 2016/0219695 A1 | 7/2016 | Choi | |
| 2018/0007798 A1 | 1/2018 | Yamaguchi et al. | |
| 2018/0124924 A1 | 5/2018 | Cho | |
| 2021/0045253 A1* | 2/2021 | Cho | H05K 3/325 |

* cited by examiner

PRESSING METHOD OF A FLEXIBLE PRINTED CIRCUIT BOARD AND A SUBSTRATE

CROSS-REFERENCE TO RELATED APPLICATIONS

This application is a divisional of U.S. patent application Ser. No. 15/688,381, filed on Aug. 28, 2017, now U.S. Pat. No. 10,849,237, which application claims priority to and the benefit of Korean Patent Application No. 10-2016-0142265, filed on Oct. 28, 2016 in the Korean Intellectual Property Office, the entire content of each of which is incorporated herein by reference.

BACKGROUND

1. Field

Aspects of embodiments of the present disclosure relate to a press apparatus and a pressing method thereof.

2. Description of the Related Art

A display device refers to a device displaying an image signal. The display device may include a liquid crystal display device (LCD), a plasma display panel device (PDP), a field emission display device (FED), an organic light emitting device (OLED), or an electrophoretic display device (EPD), for example.

Recently, research is being actively conducted on a flexible display device, which uses a flexible material, such as plastic, such that even though the display device is bent like a paper, display performance is maintained. The flexible display device uses a flexible substrate having improved flexibility, and a plastic or resin material may be used as a material of the flexible substrate.

SUMMARY

According to aspects of the present disclosure, a press apparatus is capable of precisely pressing a flexible printed circuit board to a substrate of a display device, and a pressing method thereof is also provided.

According to an exemplary embodiment of the present disclosure, a press apparatus includes: a stage to support a first substrate and a second substrate of a display device; a fixing member to fix a flexible printed circuit board connected with the first substrate onto the second substrate; and a press member to press first pad electrodes of the flexible printed circuit board and second pad electrodes of the second substrate, and the fixing member is configured to press a pad electrode-free area of the flexible printed circuit board.

The fixing member may include a press jig to press the pad electrode-free area.

The press jig may include a first surface contactable with the pad electrode-free area, and a second surface surrounding a circumference of the first surface.

The first surface may be a planar surface.

The first surface may be a curved surface.

The press jig may be shiftable in a direction vertical to the stage or may be shiftable in a direction parallel to the stage.

The press jig may be contactable with the pad electrode-free area, and then may be shiftable toward the first substrate.

The fixing member may include a guide pin passable through a first coupling hole formed in the flexible printed circuit board and a second coupling hole formed in the second substrate.

A part of the guide pin may be configured to press the pad electrode-free area.

At least one of the first substrate or the second substrate may be flexible.

The first pad electrodes, the first coupling hole, and the pad electrode-free area is sequentially located toward the first substrate.

The first substrate may be a touch substrate, and the second substrate may be a touch circuit substrate driving the touch substrate.

According to an aspect of another exemplary embodiment of the present disclosure, a pressing method of a press apparatus includes: providing a first substrate connected with a flexible printed circuit board onto a stage; providing a second substrate onto the stage; arranging the flexible printed circuit board on the second substrate; pressing a pad electrode-free area of the flexible printed circuit board; and pressing first pad electrodes of the flexible printed circuit board and second pad electrodes of the second substrate.

The pressing of the pad electrode-free area may include: passing a guide pin through a first coupling hole formed in the flexible printed circuit board and a second coupling hole formed in the second substrate; and pressing the pad electrode-free area by using the guide pin.

The pressing of the pad electrode-free area may include pressing the pad electrode-free area of the flexible printed circuit board by using a press jig.

The pressing of the pad electrode-free area of the flexible printed circuit board by using the press jig may include: contacting the pad electrode-free area with the press jig; and shifting the press jig toward the first substrate.

According to an exemplary embodiment of the present disclosure, a press apparatus includes: a stage to support a first substrate and a second substrate of a display device; a guide pin to fix a flexible printed circuit board connected with the first substrate onto the second substrate; a press member to press first pad electrodes of the flexible printed circuit board and second pad electrodes of the second substrate; and a press jig to press a pad electrode-free area of the flexible printed circuit board.

The guide pin may be passable through a first coupling hole formed in the flexible printed circuit board and a second coupling hole formed in the second substrate.

The first substrate may be a touch substrate, and the second substrate may be a touch circuit substrate driving the touch substrate.

The first pad electrodes, the first coupling hole, and the pad electrode-free area may be sequentially located toward the first substrate.

According to aspects of a press apparatus and a pressing method thereof according to one or more exemplary embodiments of the present disclosure, a pad electrode-free area of a flexible printed circuit board is pressed by using the press jig, such that it is possible to prevent or substantially prevent tension generated by the pad electrode-free area from influencing contact areas between pad electrodes of the flexible printed circuit board and pad electrodes of a substrate. Accordingly, the pad electrodes of the flexible printed circuit board and the pad electrodes of the substrate may be aligned so as to correspond to one another, and the substrate and the flexible printed circuit board may be precisely pressed.

BRIEF DESCRIPTION OF THE DRAWINGS

Some example embodiments will be described more fully herein with reference to the accompanying drawings; however, the present disclosure may be embodied in different forms and should not be construed as limited to the example embodiments set forth herein. Rather, these embodiments are provided so that this disclosure will be thorough and complete, and will fully convey the scope of the present disclosure to those skilled in the art.

In the drawing figures, dimensions may be exaggerated for clarity of illustration. Like reference numerals refer to like elements throughout.

DETAILED DESCRIPTION

Figure 1:
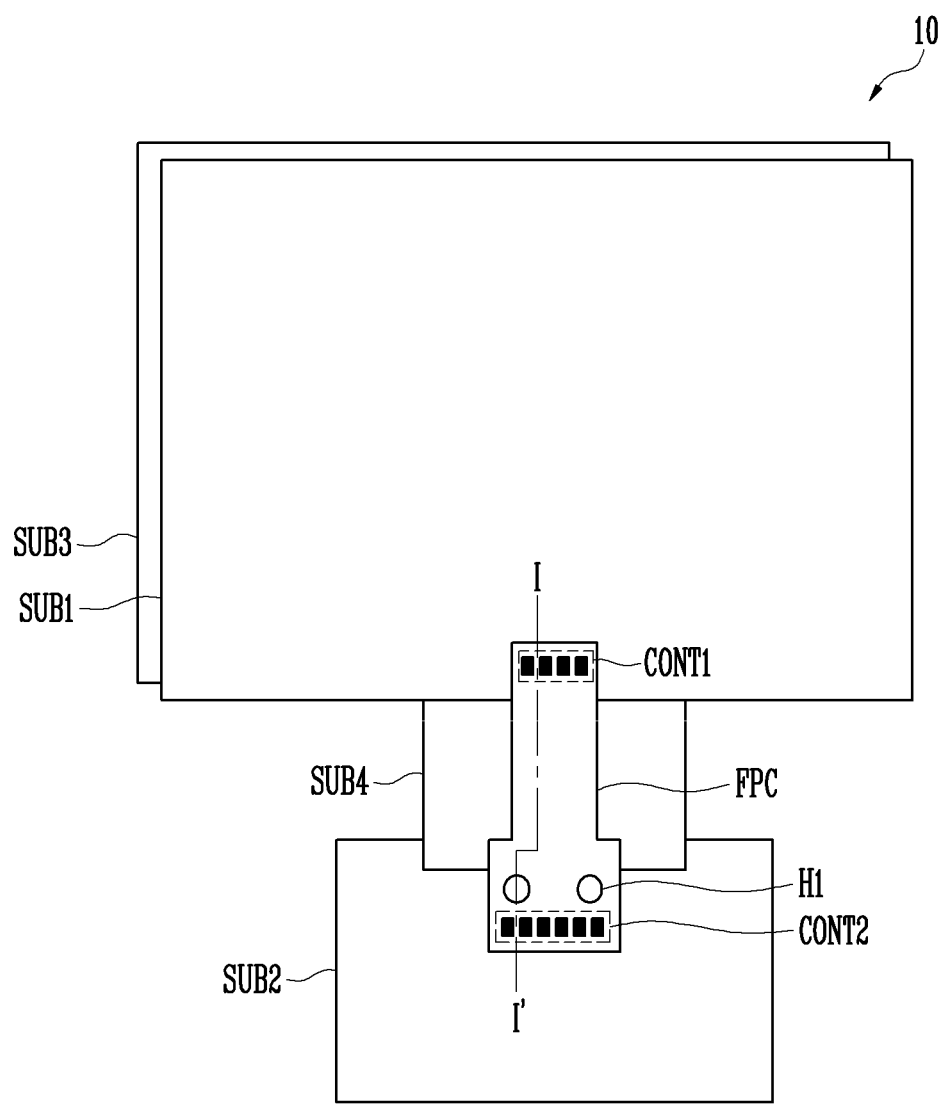
FIG. 1 is a schematic top plan view illustrating a display device according to an exemplary embodiment of the present disclosure.

In some exemplary embodiments according to the present disclosure described herein, any specific structural or functional description provided is simply illustrative for the purpose of explaining the exemplary embodiments according to the concept of the present disclosure. However, the concept of the present disclosure may be carried out in various forms, and the present disclosure is not limited to the exemplary embodiments described herein.

Further, the exemplary embodiments according to the concept of the present disclosure may be variously modified and have various forms, even though some specific exemplary embodiments are illustrated in the drawings and described in further detail herein. However, this is not intended to limit the exemplary embodiments according to the concept of the present disclosure to specific disclosed forms, and the present disclosure includes all of the changes, the equivalent matters, or the replacement matters included in the spirit and the technical scope of the present disclosure.

Terms, such as "first," "second," and the like may be used for describing various constituent elements, but the constituent elements are not to be limited by the terms. Rather, these terms are used only for the purpose of discriminating one constituent element from another constituent element, for example, without departing from the scope according to the concept of the present disclosure, and a first constituent element may be named as a second constituent element, and similarly a second constituent element may be named as a first constituent element. Further, it is to be understood that when an element is referred to as being "between" two elements, it can be the only element between the two elements, or one or more intervening elements may also be present.

Terms used in the present application are used only to describe specific exemplary embodiments, and are not intended to limit the present disclosure. As used herein, the singular forms are intended to include the plural forms as well, unless the context clearly indicates otherwise. In this specification, it is to be understood that the terms "include" or "have" indicate that a feature, a number, a step, an operation, a component, a part, or a combination thereof described in the specification is present, but does not exclude a possibility of presence or addition of one or more other features, numbers, steps, operations, components, parts, or combinations thereof.

Unless they are contrarily defined, all terms used herein including technological or scientific terms have the same meaning as those generally understood by a person with ordinary skill in the art. Terms which are defined in a generally used dictionary should be interpreted to have the same meaning as the meaning in the context of the related art, but are not to be interpreted to have an ideally or excessively formal meaning if it is not clearly defined herein.

Herein, some exemplary embodiments of the present disclosure will be described in further detail with reference to the accompanying drawings.

FIG. 1 is a schematic top plan view illustrating a display device according to an exemplary embodiment of the present disclosure.

Referring to FIG. 1, a display device 10 according to an exemplary embodiment of the present disclosure may include a first substrate SUB1, a second substrate SUB2, a third substrate SUB3, and a flexible printed circuit board FPC.

In an embodiment, the first to third substrates SUB1 to SUB3 may be provided in a rectangular plate shape having two pairs of parallel sides. In the first to third substrates SUB1 to SUB3, any one pair of sides of the two pairs of sides may be provided to be longer than the other pair of sides, but the first to third substrates SUB1 to SUB3 are not limited thereto.

For example, the first to third substrates SUB1 to SUB3 may be provided in any of various shapes, such as a polygon having a closed shape including a straight side, a circle or an ellipse including a curved side, or a semicircle or a half ellipse including a side formed of a straight line and a curved line.

In an embodiment, the first substrate SUB1 may include a touch sensor recognizing a touch. The touch sensor may be implemented in a capacitive method or a piezoresistive method.

For example, the first substrate SUB1 may include driving electrodes and sensing electrodes, and may detect capacitance which is varied in response to a touch event generated by a hand of a user or a separate input means. The touch sensor may be configured by a mutual capacitance method or a self-capacitance method.

In an embodiment, the second substrate SUB2 may include a touch driving circuit controlling a touch detection of the first substrate SUB1.

For example, the touch driving circuit may provide a driving signal to the first substrate SUB1 through the flexible printed circuit board FPC, or may detect a touch position by using a detection signal provided from the first substrate SUB1.

In an embodiment, the third substrate SUB3 may include a display unit including pixels. For example, each of the pixels is a minimum unit displaying an image, and may be disposed on the third substrate SUB3. For example, the pixel may emit any one of red, green, and blue, but is not limited thereto, and may emit a color, such as cyan, magenta, or yellow.

The third substrate SUB3 may display visual information (e.g., predetermined visual information), for example, text, a video, a picture, or a 2D or 3D image, through the pixels. The kind of display unit is not particularly limited as long as the display unit displays an image, and may include any of an organic light emitting display panel, a liquid crystal display panel, and a plasma display panel.

In an embodiment, a fourth substrate SUB4 may be connected to the third substrate SUB3 and include a driving IC for driving the display unit.

One side of the flexible printed circuit board FPC may be attached to the first substrate SUB1, and the other side thereof may be attached to the second substrate SUB2.

The flexible printed circuit board FPC may be electrically connected with the first substrate SUB1 through pad electrodes formed in a first contact area CONT1, and may be electrically connected with the second substrate SUB2 through pad electrodes formed in a second contact area CONT2.

Further, the flexible printed circuit board FPC may include a first coupling hole H1 into which a guide pin may be inserted. During a pressing process for electrically connecting the flexible printed circuit board FPC and the second substrate SUB2, the guide pin may pass through the first coupling hole H1 to align the pad electrodes formed in the flexible printed circuit board FPC and the pad electrodes formed on the second substrate SUB2.

According to an exemplary embodiment, the fourth substrate SUB4 and the flexible printed circuit board FPC may be implemented by any of a chip on glass, a chip on plastic, a tape carrier package, a chip on film, and the like.

Further, the first to third substrates SUB1 to SUB3 may be flexible substrates, and may be implemented by any one of a film including a polymer organic material having a flexible characteristic and a plastic substrate.

According to an exemplary embodiment, the first to third substrates SUB1 to SUB3 may be formed of at least one of polyimide (PI), polyethylene terephthalate (PET), polyethylene naphthalate (PEN), polycarbonate (PC), polyarylate (PAR), polyetherimide (PEI), polyethersulphone (PES), polyethylene etherphthalate, poly arylate, and polyacrylate, but are not limited thereto, and the first to third substrates SUB1 to SUB3 may be formed of a plastic film formed of an organic material or various flexible materials, such as metal foil or a thin film.

FIGS. 2A, 2B, 2C, and 2D are schematic cross-sectional views for describing a pressing method of a press apparatus according to an exemplary embodiment of the present disclosure.

FIGS. 2A to 2D are cross-sectional views schematically illustrating the display device 10 taken along line I-I' of FIG. 1 for convenience of the description of the pressing method by a press apparatus 100.

Figure 2A:
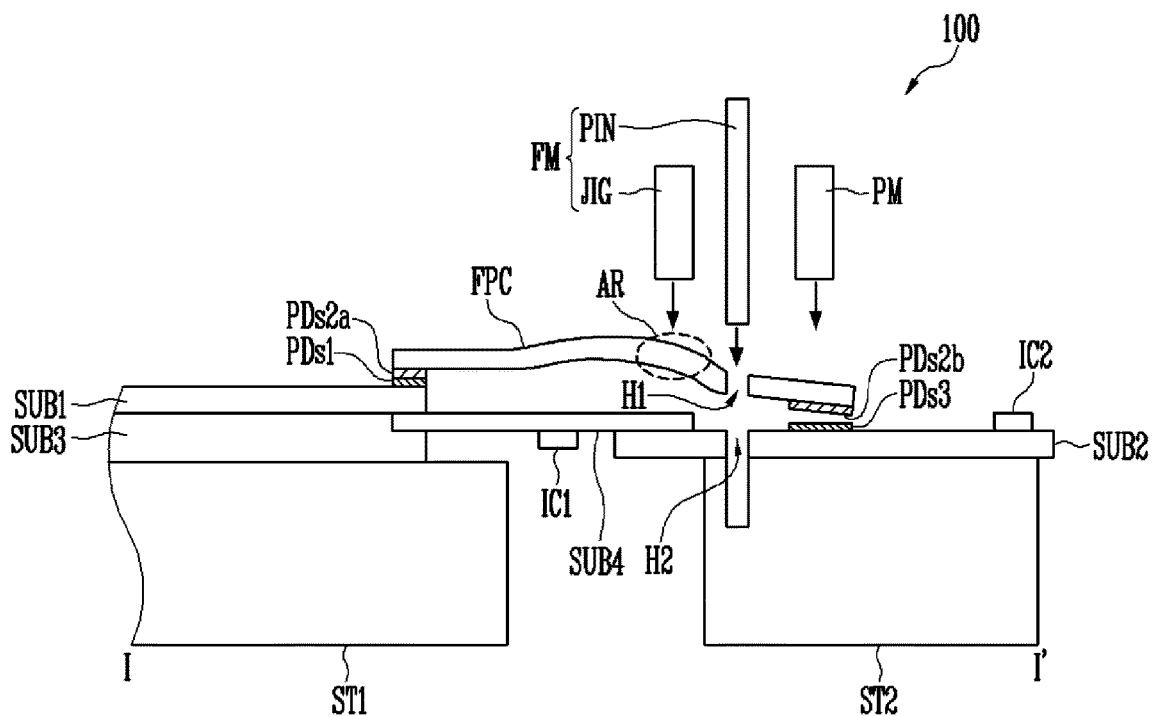
FIGS. 2A, 2B, 2C, and 2D are schematic cross-sectional views for describing a pressing method of a press apparatus according to an exemplary embodiment of the present disclosure.

Referring to FIG. 2A, the press apparatus 100 according to an exemplary embodiment of the present disclosure may include a first stage ST1, a second stage ST2, a fixing member FM including a guide pin PIN and a press jig JIG, and a press member PM.

The first stage ST1 may support the third substrate SUB3 and the first substrate SUB1 disposed on the third substrate SUB3. Further, the third substrate SUB3 may be connected with the fourth substrate SUB4 including a driving IC IC1 controlling the driving of the third substrate SUB3. Further, the first stage ST1 may stably fix the first and third substrates SUB1 and SUB3 so as to prevent or substantially prevent the first and third substrates SUB1 and SUB3 from moving.

Pad electrodes PDs1 of the first substrate SUB1 may be connected with first pad electrodes PDs2a of the flexible printed circuit board FPC. In an embodiment, the pad electrodes PDs1 of the first substrate SUB1 may be electrically connected with the first pad electrode PDs2a of the flexible printed circuit board FPC by a previously performed pressing process.

The second stage ST2 may support the second substrate SUB2, and may stably fix the second substrate SUB2 so as to prevent or substantially prevent the second substrate SUB2 from moving. The second substrate SUB2 may be connected with the fourth substrate SUB4, and may include a driving IC IC2 that is capable of controlling the driving of the first substrate SUB1.

In an exemplary embodiment of the present disclosure, it is illustrated that the first stage ST1 and the second stage ST2 are separate elements which are disposed while being spaced apart from each other; however, the first stage ST1 and the second stage ST2 are not limited thereto, and may be implemented with one stage.

In order to perform the pressing process between the flexible printed circuit board FPC and the second substrate SUB2, the flexible printed circuit board FPC may be disposed on the second substrate SUB2. Particularly, second pad electrodes PDs2b of the flexible printed circuit board FPC may be disposed on pad electrodes PDs3 of the second substrate SUB2.

Since the flexible printed circuit board FPC and the fourth substrate SUB4 may be bent to a rear surface of the third substrate SUB3 in a subsequent process after the pressing process, the flexible printed circuit board FPC is formed to be longer than the fourth substrate SUB4 according to a position design of the flexible printed circuit board FPC and the fourth substrate SUB4. Accordingly, a lifted area AR is generated in the flexible printed circuit board FPC. The lifted area AR is a pad electrode-free area. The pad electrodes PDs2b, the first coupling hole H1, and the lifted area AR are sequentially located toward the first substrate SUB1.

Figure 2B:
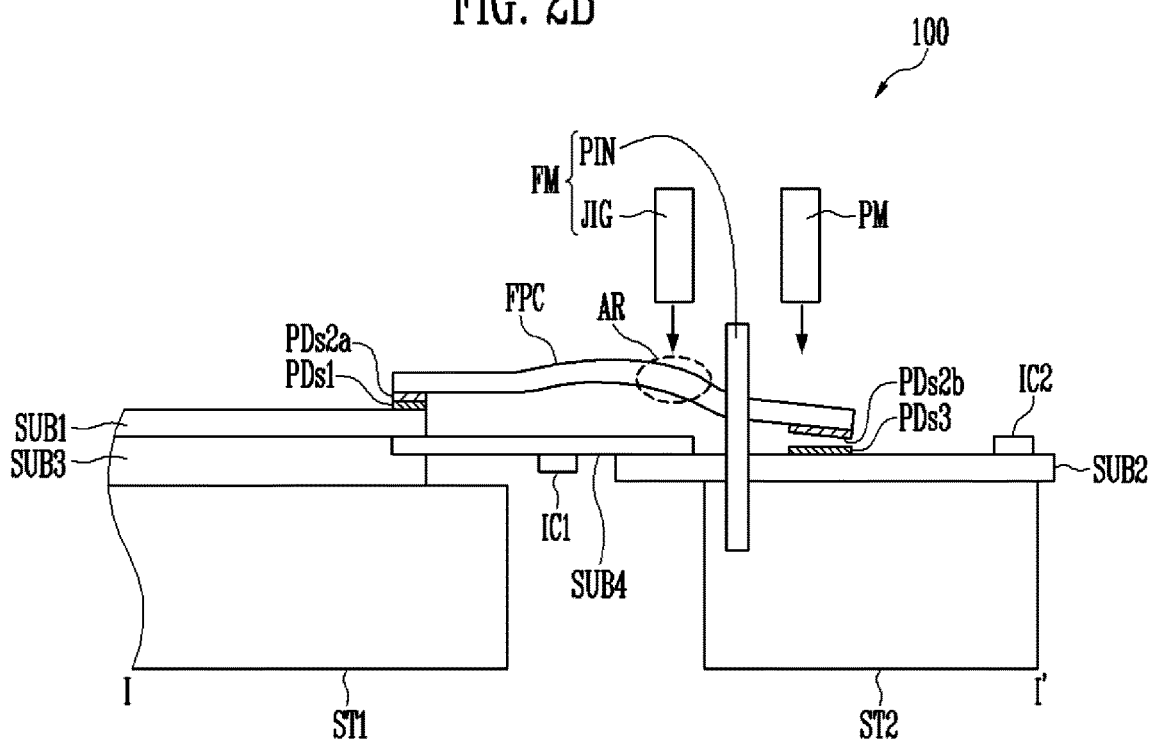

Referring to FIG. 2B, the press apparatus 100 may fix the flexible printed circuit board FPC by using the guide pin PIN such that the flexible printed circuit board FPC does not move on the second substrate SUB2. Particularly, the press apparatus 100 may pass the guide pin PIN through the first coupling hole H1 of the flexible printed circuit board FPC and the second coupling hole H2 of the second substrate SUB2 to align the second pad electrodes PDs2b of the flexible printed circuit board FPC and the pad electrodes PDs3 of the second substrate SUB2 to face one another.

In an embodiment, a diameter of the guide pin PIN does not completely correspond to a diameter of the first coupling hole H1, such that a gap may be generated between the guide pin PIN and the first coupling hole H1. Accordingly, the guide pin PIN may be positioned to be biased to one side within the first coupling hole H1 by tension generated in the lifted area AR of the flexible printed circuit board FPC. The second pad electrodes PDs2*b* of the flexible printed circuit board FPC and the pad electrodes PDs3 of the second substrate SUB2 may be alternately disposed by the tension generated in the lifted area AR of the flexible printed circuit board FPC.

Figure 2C:
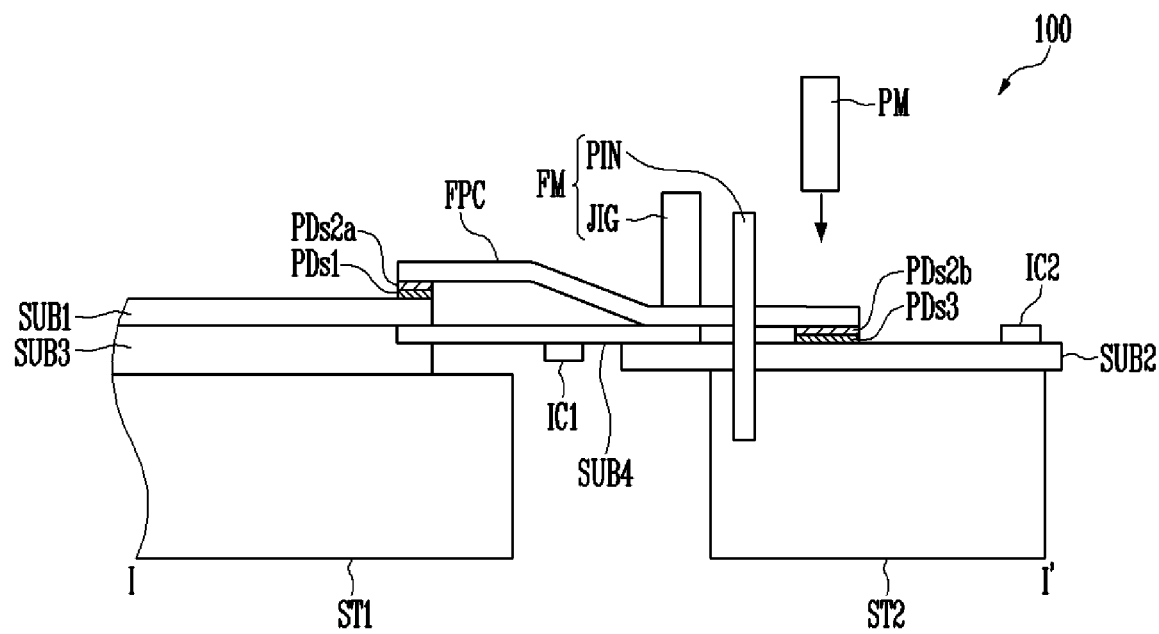

Referring to FIG. 2C, the press apparatus 100 may align the second pad electrodes PDs2*b* of the flexible printed circuit board FPC and the pad electrodes PDs3 of the second substrate SUB2 to correspond to one another by the press jig JIG.

The press jig JIG may press a region adjacent to the guide pin PIN in the flexible printed circuit board FPC to cause the lifted area AR to be flat. That is, the press jig JIG may press the lifted area AR adjacent to the guide pin PIN to block tension generated by the lifted area AR.

Since the first coupling hole H1 is not influenced by the tension generated from the lifted area AR, the guide pin PIN may be disposed at a target position within the first coupling hole H1, and the second pad electrodes PDs2*b* of the flexible printed circuit board FPC may be aligned on the pad electrodes PDs3 of the second substrate SUB2 so as to correspond to the pad electrodes PDs3 of the second substrate SUB2.

Further, although not illustrated in FIGS. 2A to 2D, the press apparatus 100 according to an exemplary embodiment of the present disclosure may include a shifting member.

The shifting member may shift the press jig JIG in a direction vertical to the second stage ST2 or may shift the press jig JIG in a direction parallel to the second stage ST2.

According to an exemplary embodiment, the shifting member may shift the press jig JIG by using a transport rail.

For example, the shifting member may shift the press jig JIG such that the press jig JIG is in contact with the lifted area AR of the flexible printed circuit board FPC and then moves away from the guide pin PIN. In this case, according to the shift of the press jig JIG, the flexible printed circuit board FPC may receive the tension in the shift direction of the shifting member, and the first coupling hole H1 coupled with the guide pin PIN may also receive the tension in the shift direction. That is, the shifting member may shift the first coupling hole H1 in the direction of the tension, and adjust a position of the guide pin PIN within the first coupling hole H1. Through the process, the second pad electrodes PDs2*b* of the flexible printed circuit board FPC may be disposed on the third pad electrodes PDs3 of the second substrate SUB2.

FIG. 2C illustrates that the press jig JIG presses the lifted area AR of the flexible printed circuit board FPC outside the second stage ST2, but the present disclosure is not limited thereto, and the press jig JIG may press the lifted area AR of the flexible printed circuit board FPC on the second stage ST2.

Figure 2D:
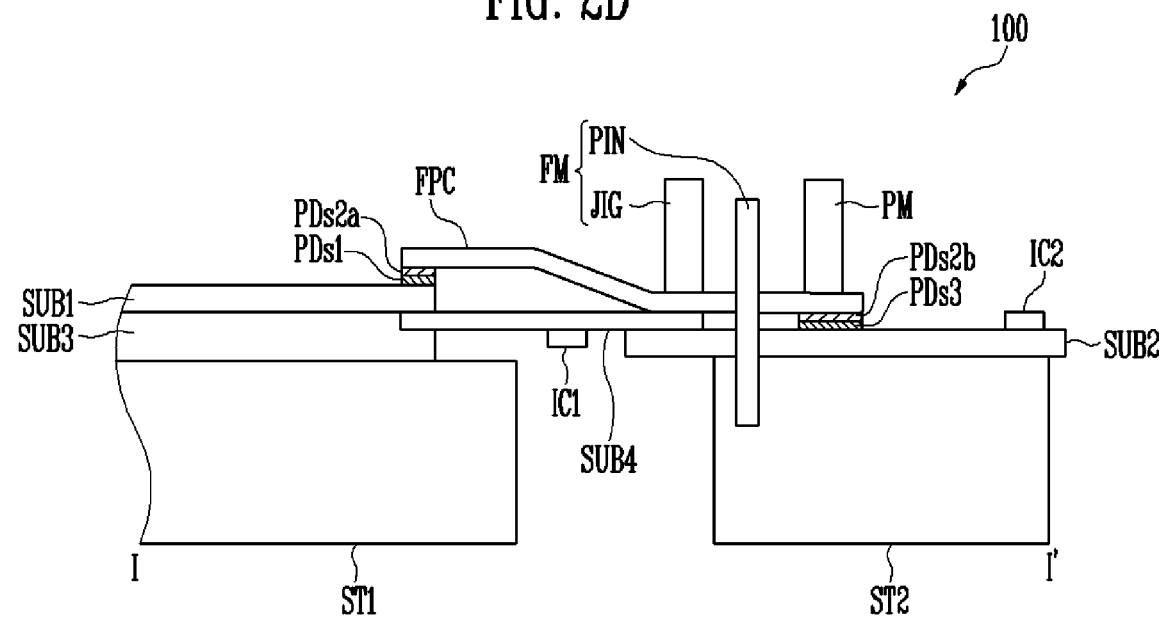

Referring to FIG. 2D, the press member PM may press the second pad electrodes PDs2*b* of the flexible printed circuit board FPC and the pad electrodes PDs3 of the second substrate SUB2 to electrically connect the second pad electrodes PDs2*b* of the flexible printed circuit board FPC and the pad electrodes PDs3 of the second substrate SUB2. In an embodiment, for example, the press member PM may heat the second pad electrodes PDs2*b* and the pad electrodes PDs3 at a temperature (e.g., a predetermined temperature) to bond the second pad electrodes PDs2*b* and the pad electrodes PDs3.

FIGS. 3A, 3B, 3C, and 3D are schematic cross-sectional views for describing a pressing method of a press apparatus according to another exemplary embodiment of the present disclosure.

In order to avoid repeating description, in FIGS. 3A, 3B, 3C, and 3D, aspects different from those of the exemplary embodiment shown in FIGS. 2A, 2B, 2C, and 2D will be mainly described. Parts which are not specifically described with reference to FIGS. 3A, 3B, 3C, and 3D will follow those of the aforementioned exemplary embodiment, and the same reference numeral refers to the same element, and the similar reference numeral refers to the similar element.

Figure 3A:
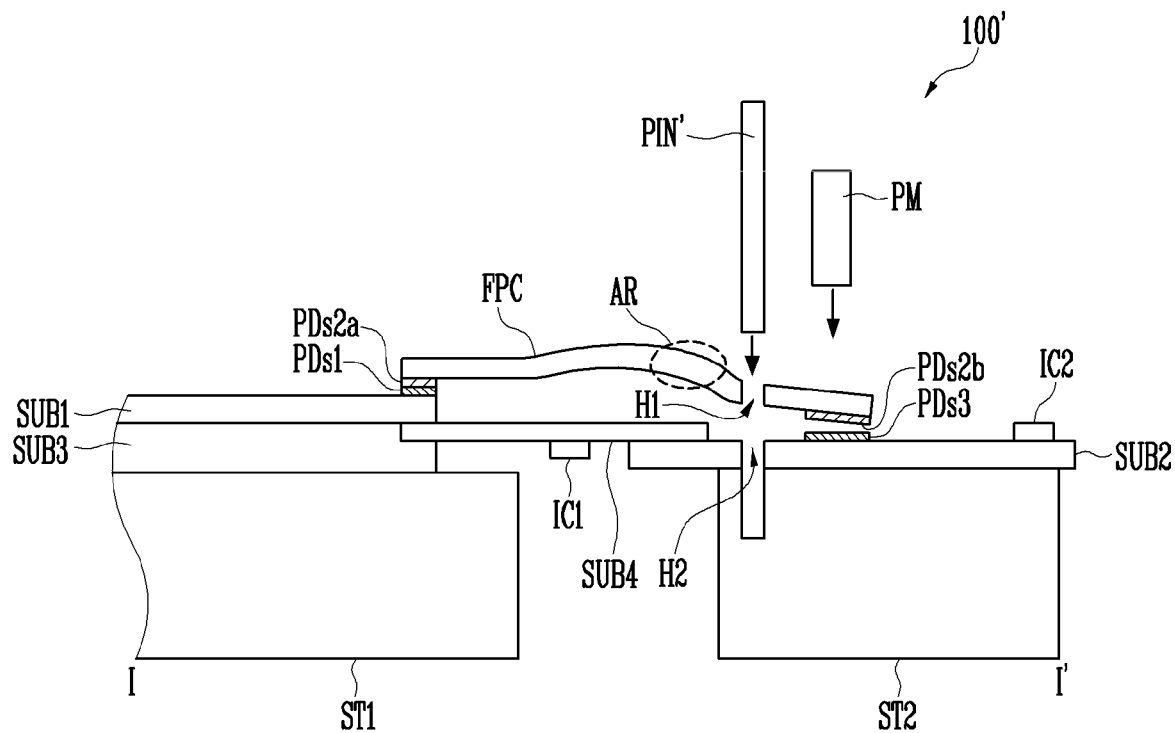
FIGS. 3A, 3B, 3C, and 3D are schematic cross-sectional views for describing a pressing method of a press apparatus according to another exemplary embodiment of the present disclosure.
Figure 3B:
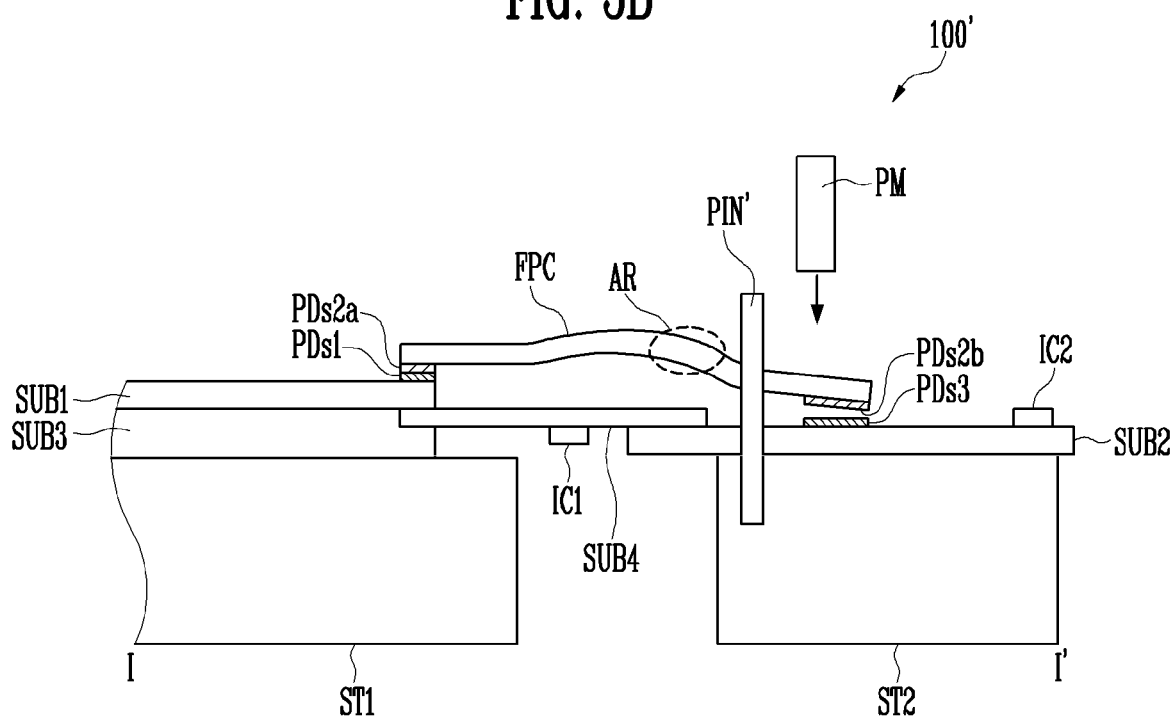

Referring to FIGS. 3A and 3B, a press apparatus 100' according to another exemplary embodiment of the present disclosure may include a first stage ST1, a second stage ST2, a guide pin PIN', and a press member PM.

The press apparatus 100' may fix a flexible printed circuit board FPC by using the guide pin PIN' such that the flexible printed circuit board FPC does not move on a second substrate SUB2. Particularly, the press apparatus 100' may pass the guide pin PIN' through a first coupling hole H1 of the flexible printed circuit board FPC and a second coupling hole H2 of the second substrate SUB2 to align second pad electrodes PDs2*b* of the flexible printed circuit board FPC and pad electrodes PDs3 of the second substrate SUB2 to face one another.

In an embodiment, a diameter of the guide pin PIN' does not completely correspond to a diameter of the first coupling hole H1, such that a gap may be generated between the guide pin PIN' and the first coupling hole H1. Accordingly, the guide pin PIN' may be positioned to be biased to one side within the first coupling hole H1 by tension generated in a lifted area AR of the flexible printed circuit board FPC. The second pad electrodes PDs2*b* of the flexible printed circuit board FPC and the pad electrodes PDs3 of the second substrate SUB2 may be alternately disposed by the tension generated in the lifted area AR of the flexible printed circuit board FPC.

Figure 3C:
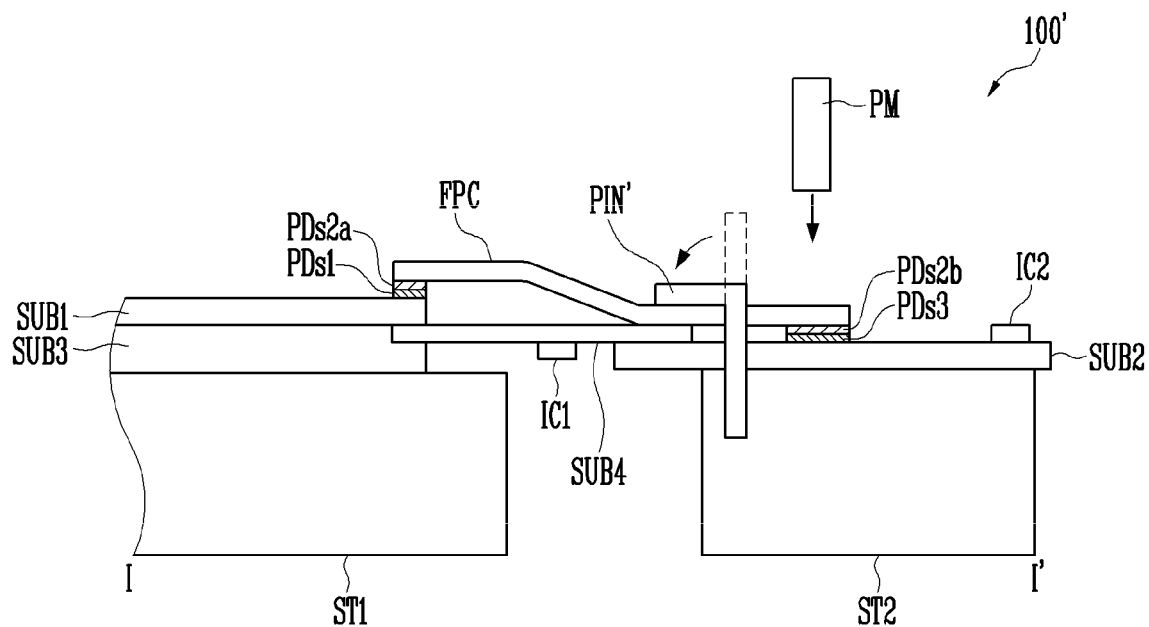

Referring to FIG. 3C, the press apparatus 100' may align the second pad electrodes PDs2*b* of the flexible printed circuit board FPC and the pad electrodes PDs3 of the second substrate SUB2 to correspond using the guide pine PIN'.

The guide pin PIN' may be partially bent or folded in a direction of a first substrate SUB1 to press the lifted area AR, thereby blocking the tension generated in the lifted area AR.

Since the first coupling hole H1 is not influenced by the tension generated from the lifted area AR, the guide pin PIN' may be disposed at a target position within the first coupling hole H1, and the second pad electrodes PDs2*b* of the flexible printed circuit board FPC may be aligned on the pad electrodes PDs3 of the second substrate SUB2 so as to correspond to the pad electrodes PDs3 of the second substrate SUB2.

FIG. 3C illustrates a rectangular guide pin PIN', a part of which is bent or folded; however, the present disclosure is not limited thereto, and a shape of the guide pin PIN' may have any of various shapes.

Figure 3D:
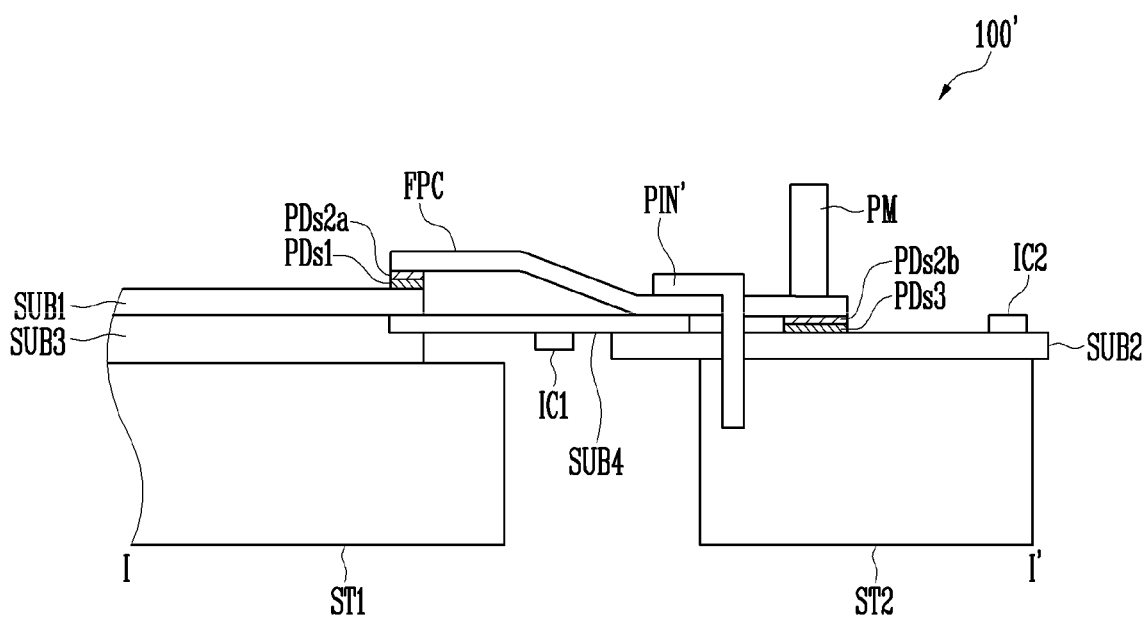

Referring to FIG. 3D, the press member PM may press the second pad electrodes PDs2*b* of the flexible printed circuit board FPC and the pad electrodes PDs3 of the second substrate SUB2 to electrically connect the second pad electrodes PDs2*b* of the flexible printed circuit board FPC and the pad electrodes PDs3 of the second substrate SUB2. In an embodiment, for example, the press member PM may heat the second pad electrodes PDs2*b* and the pad electrodes PDs3 at a temperature (e.g., a predetermined temperature) to bond the second pad electrodes PDs2*b* and the pad electrodes PDs3.

Figure 4A:
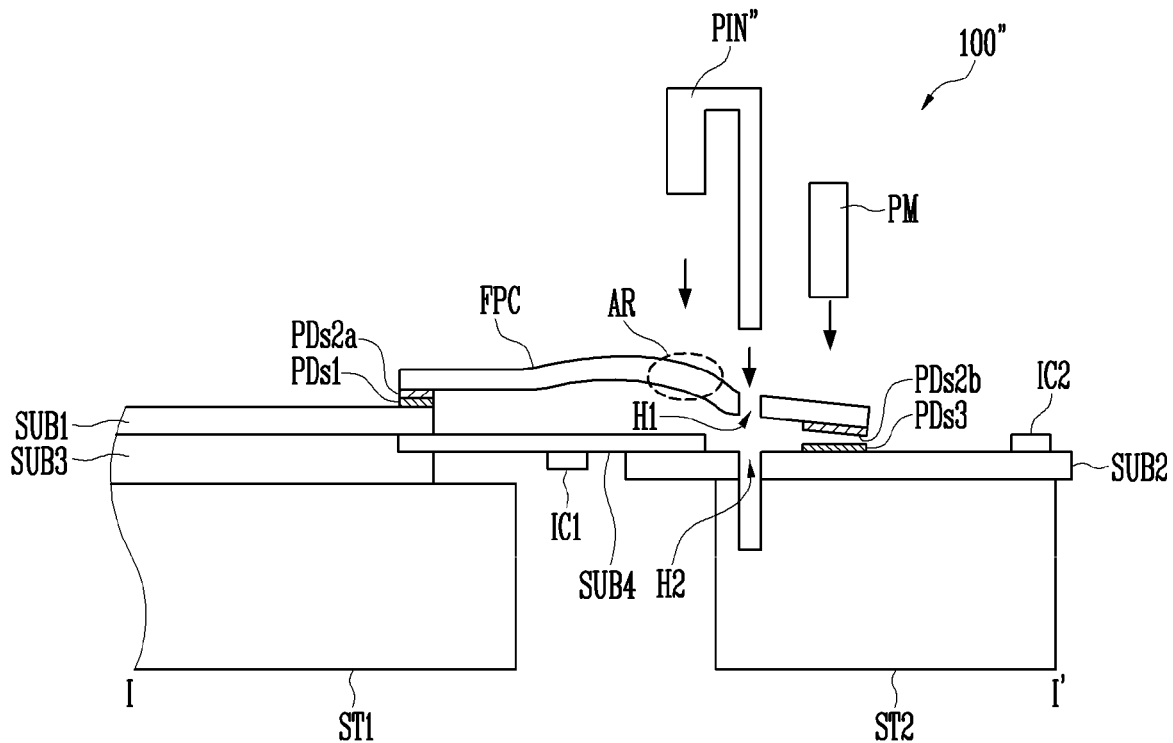
FIGS. 4A, 4B, and 4C are schematic cross-sectional views for describing a pressing method of a press apparatus according to another exemplary embodiment of the present disclosure.
Figure 4B:
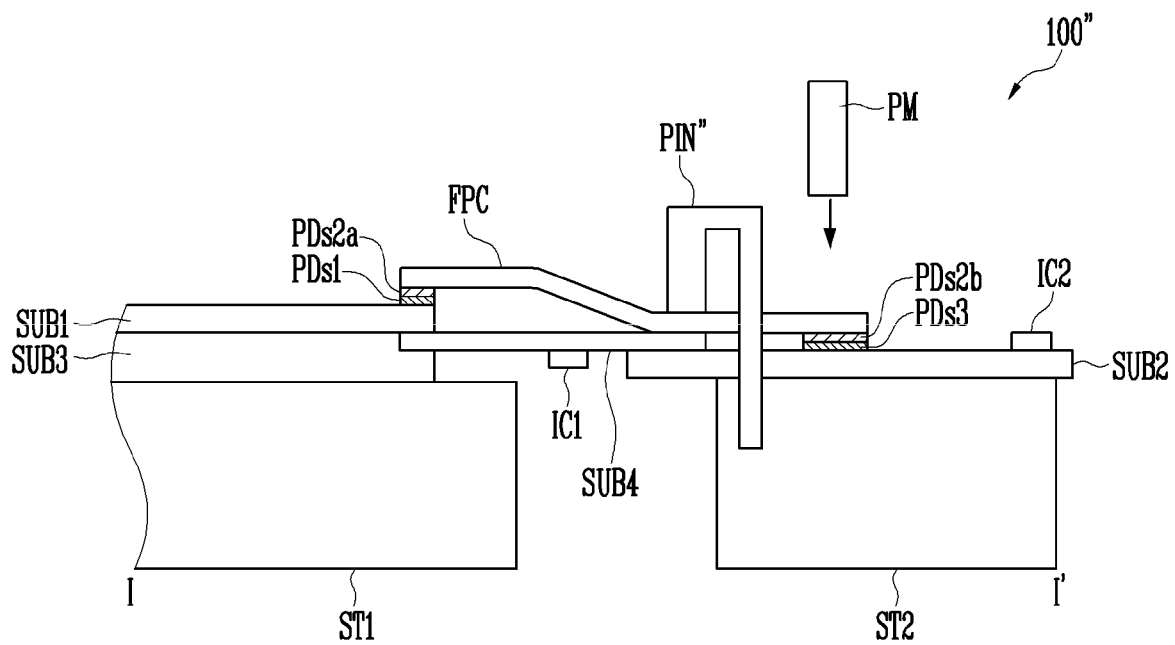
Figure 4C:
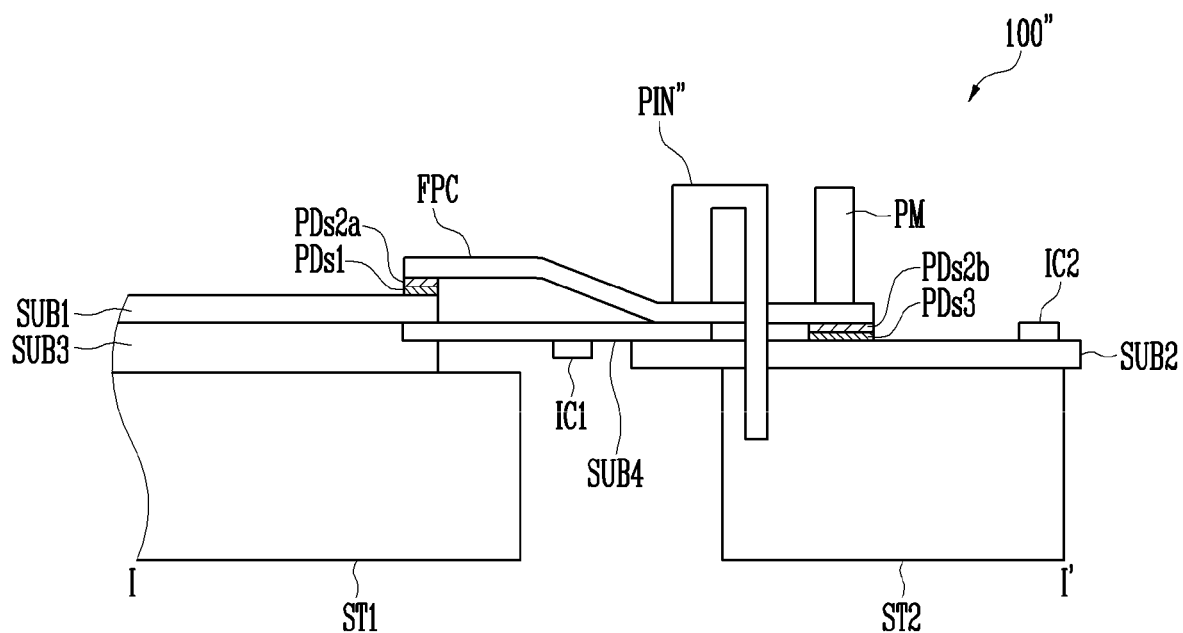

FIGS. 4A, 4B, and 4C are schematic cross-sectional views for describing a pressing method of a press apparatus according to another exemplary embodiment of the present disclosure.

In order to avoid repeating description, in FIGS. 4A, 4B, and 4C, aspects different from those of the aforementioned exemplary embodiments will be mainly described. Parts which are not specifically described with reference to FIGS. 4A, 4B, and 4C will follow those of the aforementioned exemplary embodiments, and the same reference numeral refers to the same element, and the similar reference numeral refers to the similar element.

Referring to FIGS. 4A and 4B, a press apparatus 100" according to an exemplary embodiment of the present disclosure may include a first stage ST1, a second stage ST2, a guide pin PIN", and a press member PM.

The press apparatus 100" may fix a flexible printed circuit board FPC by using the guide pin PIN" such that the flexible printed circuit board FPC does not move on a second substrate SUB2. In an embodiment, the press apparatus 100" may pass the guide pin PIN" through a first coupling hole H1 of the flexible printed circuit board FPC and a second coupling hole H2 of the second substrate SUB2 to align second pad electrodes PDs2*b* of the flexible printed circuit board FPC and pad electrodes PDs3 of the second substrate SUB2 to face one another.

Further, the guide pin PIN" may press a lifted area AR to cause the lifted area AR to be flat, thereby blocking tension generated by the lifted area AR.

As described above, the guide pin PIN" may press the lifted area AR while passing through the first coupling hole H1 and the second coupling hole H2, such that it is possible to more easily align the second pad electrodes PDs2*b* of the flexible printed circuit board FPC and the pad electrodes PDs3 of the second substrate SUB2 such that the second pad electrodes PDs2*b* of the flexible printed circuit board FPC correspond to the pad electrodes PDs3 of the second substrate SUB2.

Referring to FIG. 4C, the press member PM may press the second pad electrodes PDs2*b* of the flexible printed circuit board FPC and the pad electrodes PDs3 of the second substrate SUB2 to electrically connect the second pad electrodes PDs2*b* of the flexible printed circuit board FPC and the pad electrodes PDs3 of the second substrate SUB2. In an embodiment, for example, the press member PM may heat the second pad electrodes PDs2*b* and the pad electrodes PDs3 at a temperature (e.g., a predetermined temperature) to bond the second pad electrodes PDs2*b* and the pad electrodes PDs3.

Figure 5A:
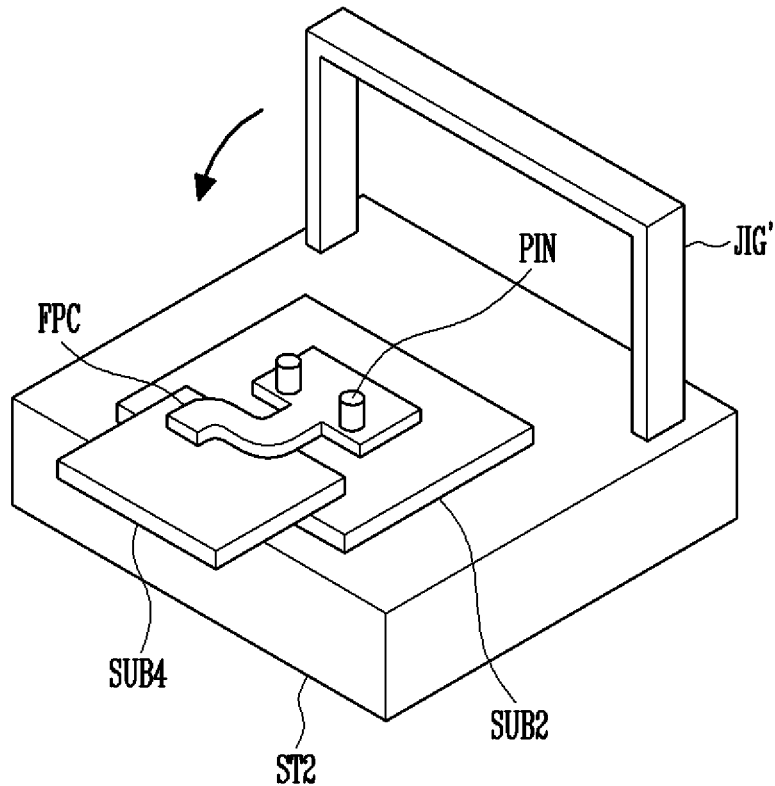
FIGS. 5A and 5B are schematic perspective views for describing a pressing method of a press apparatus according to an exemplary embodiment of the present disclosure.
Figure 5B:
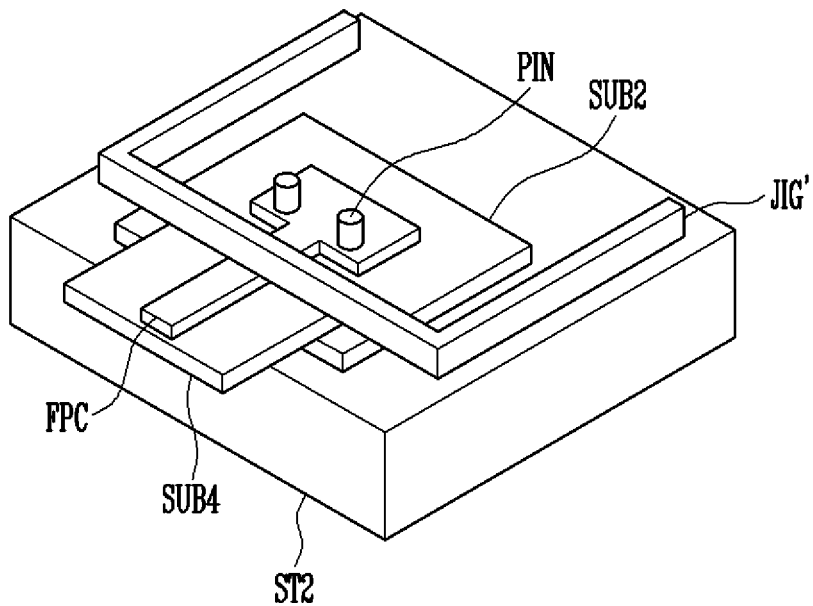

FIGS. 5A and 5B are schematic perspective views for describing a pressing method of a press apparatus according to an exemplary embodiment of the present disclosure.

In order to avoid repeating description, in FIGS. 5A and 5B, aspects different from those of the aforementioned exemplary embodiments will be mainly described. Parts which are not specifically described with reference to FIGS. 5A and 5B will follow those of the aforementioned exemplary embodiments, and the same reference numeral refers to the same element, and the similar reference numeral refers to the similar element.

Referring to FIGS. 5A and 5B, a press jig JIG' may include an elongated first side, and two second sides, which are extended from both ends of the first side in a vertical direction.

One side of the second side is connected to a second stage ST2, such that the press jig JIG' may be fixed, and the press jig JIG' may move in a direction vertical to the first side under the control of a shifting member.

The press jig JIG' may press a lifted area AR of a flexible printed circuit board FPC disposed on the second stage ST2, and the flexible printed circuit board FPC in a region adjacent to a guide pin PIN may be caused to be flat.

Figure 6A:
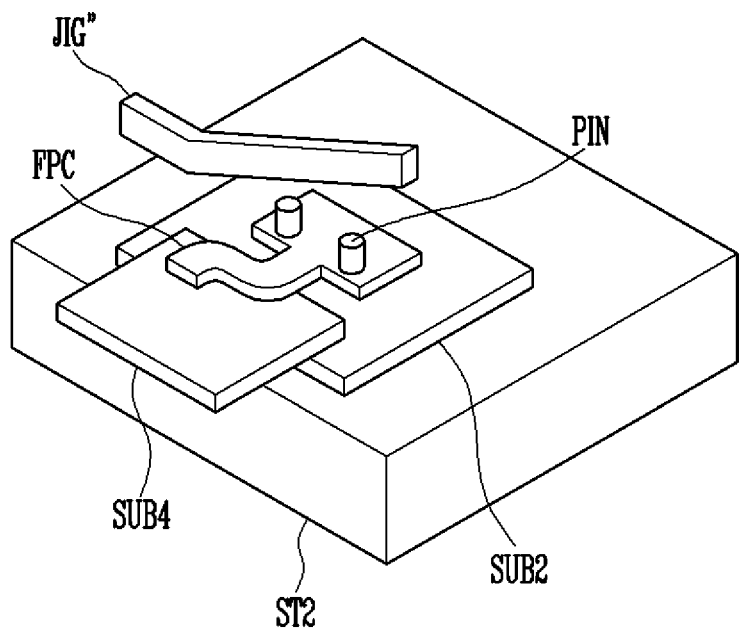
FIGS. 6A and 6B are schematic perspective views for describing a pressing method of a press apparatus according to another exemplary embodiment of the present disclosure.
Figure 6B:
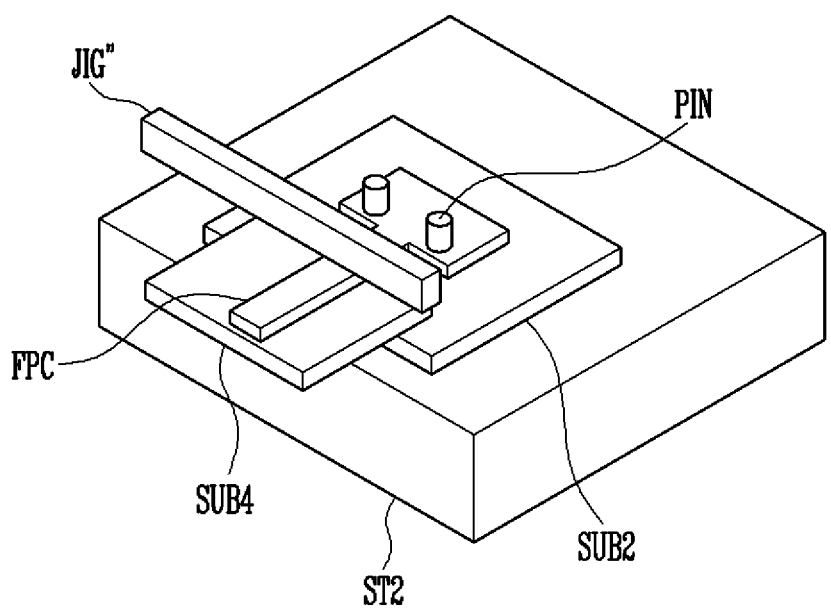

FIGS. 6A and 6B are schematic perspective views for describing a pressing method of a press apparatus according to another exemplary embodiment of the present disclosure.

In order to avoid repeating description, in FIGS. 6A and 6B, aspects different from those of the aforementioned exemplary embodiments will be mainly described. Parts which are not specifically described with reference to FIGS. 6A and 6B will follow those of the aforementioned exemplary embodiments, and the same reference numeral refers to the same element, and the similar reference numeral refers to the similar element.

Referring to FIGS. 6A and 6B, a press jig JIG" may include a first side extended in a first direction (e.g., a predetermined direction), and a second side bent in a second direction different from the first direction and extended.

The first side is connected to a second stage ST2, such that the press jig JIG" may be fixed, and the second side may move in a direction in which a flexible printed circuit board FPC is positioned, under the control of a shifting member.

The press jig JIG" may press a lifted area AR of the flexible printed circuit board FPC disposed on the second stage ST2, and the flexible printed circuit board FPC in a region adjacent to a guide pin PIN may be caused to be flat.

Figure 7A:
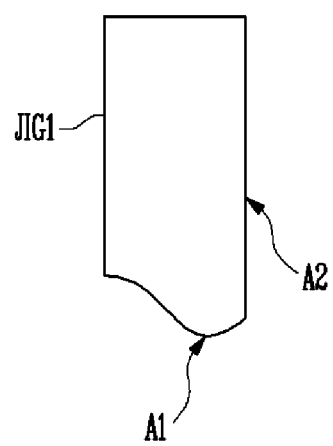
FIGS. 7A, 7B, and 7C are schematic cross-sectional views of press jigs according to an exemplary embodiment of the present disclosure.
Figure 7B:
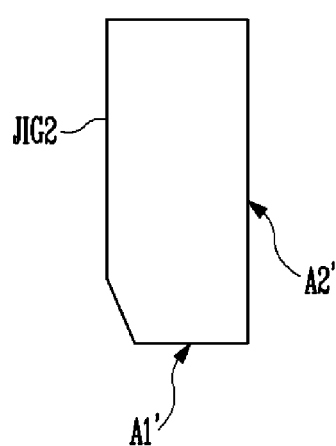
Figure 7C:
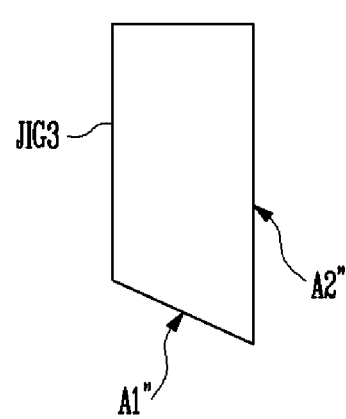

FIGS. 7A, 7B, and 7C are schematic cross-sectional views of press jigs according to exemplary embodiments of the present disclosure.

FIGS. 7A, 7B, and 7C are cross-sectional views of parts of press jigs JIG1, JIG2, and JIG3 according to exemplary embodiments of the present disclosure, and the shape of the press jigs JIG1, JIG2, and JIG3 are not limited thereto, and may be any of various shapes.

The press jigs JIG1, JIG2, and JIG3 illustrated in FIGS. 7A, 7B, and 7C may include respective first surfaces A1, A1', and A1", which are in contact with a lifted area of a flexible printed circuit board FPC, and second surfaces A2, A2', and A2", which surround the first surfaces A1, A1', and A1", respectively.

Referring to FIG. 7A, the first surface A1 of the press jig JIG1 may be formed as a curved surface. When the press jig JIG1 is in contact with the flexible printed circuit board FPC, a part of the first surface A1 may be in contact with the lifted area AR by the curved shape of the first surface A1, but the remaining part of the first surface A1 may not be in contact with the lifted area AR. Accordingly, the flexible printed circuit board FPC may receive a minimum or reduced pressing force from the press jig JIG1, thereby being prevented or substantially prevented from being damaged by the pressing force.

Referring to FIG. 7B, the first surface A1' of the press jig JIG2 may be formed as a planar surface having a smaller thickness than a thickness of the press jig JIG2.

When the first surface A1' of the press jig JIG2 is in contact with the flexible printed circuit board FPC, the flexible printed circuit board FPC may receive only a minimum or reduced pressing force from the relatively small area of the first surface A1'. Accordingly, the flexible printed circuit board FPC may be prevented or substantially prevented from being damaged by the pressing force.

Referring to FIG. 7C, the first surface A1" of the press jig JIG3 may be formed in a direction that is not vertical to the second surface A2". Accordingly, a part of the first surface A1" may be in contact with the lifted area AR, but the remaining part of the first surface A1" may not be in contact with the lifted area AR. Accordingly, the flexible printed circuit board FPC may receive a minimum or reduced pressing force from the press jig JIG3, thereby being prevented or substantially prevented from being damaged by the pressing force.

Figure 8:
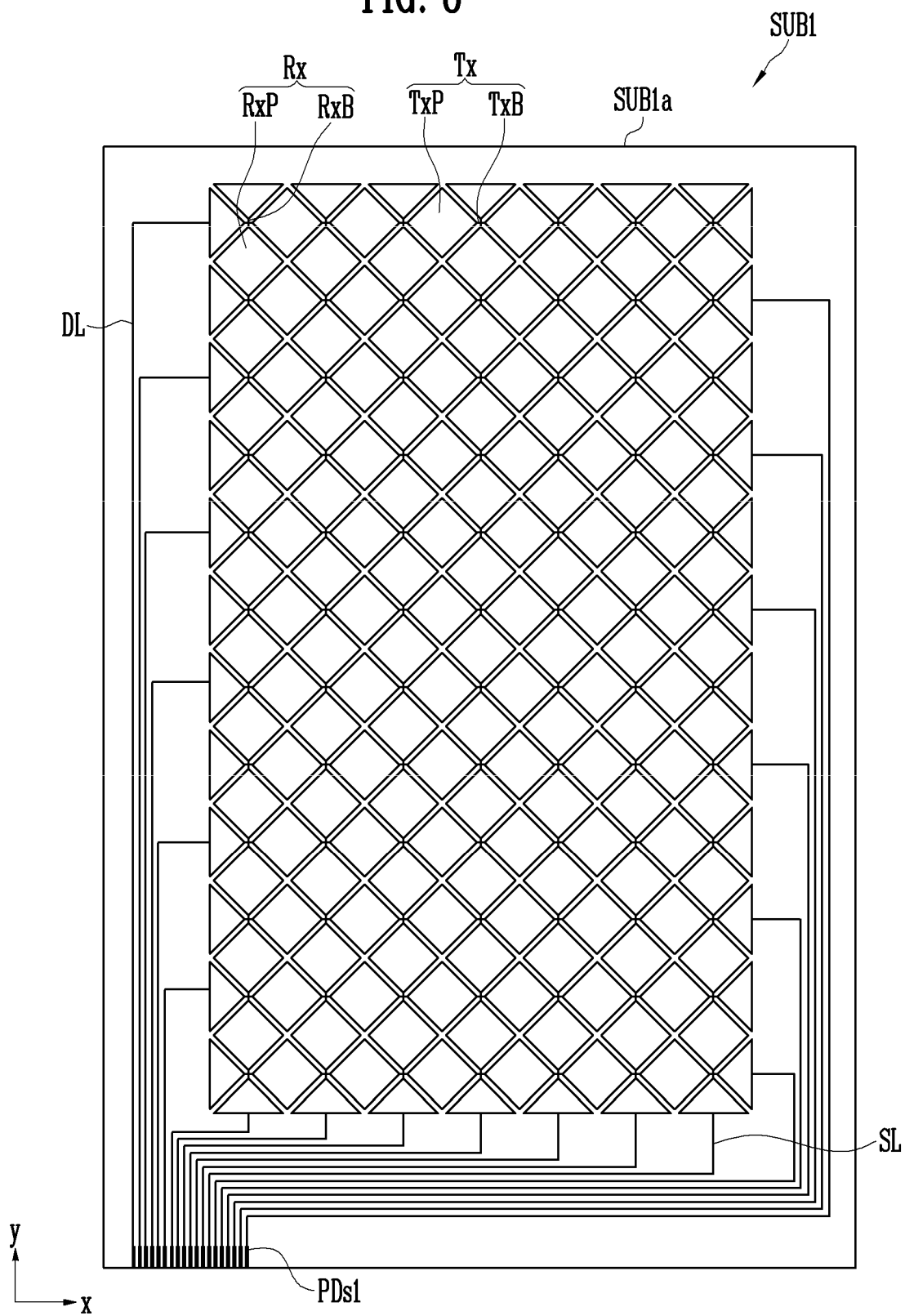
FIG. 8 is a top plan view illustrating a first substrate of a display device according to an exemplary embodiment of the present disclosure.

FIG. 8 is a top plan view illustrating a first substrate of a display device according to an exemplary embodiment of the present disclosure.

Referring to FIG. 8, a first substrate SUB1 according to an exemplary embodiment of the present disclosure may include a first sub substrate SUB1a, driving electrodes Tx, sensing electrodes Rx, and pad electrodes PDs1.

The driving electrodes Tx and the sensing electrodes Rx may be formed on the sub substrate SUB1a so as to cross one another.

The driving electrodes Tx may be extended in a first direction (for example, an x-axis direction) and the plurality of driving electrodes Tx may be disposed in a second direction (for example, a y-axis direction) crossing the first direction. The sensing electrodes Rx may be extended in the second direction, and the plurality of sensing electrodes Rx may be disposed in the first direction.

The driving electrodes Tx may include a plurality of driving cells TxP arranged in the first direction with an interval (e.g., a predetermined interval), and a plurality of driving patterns TxB electrically connecting the driving cells TxP.

The sensing electrodes Rx may include a plurality of sensing cells RxP arranged in the second direction with an interval (e.g., a predetermined interval) and distributed between the driving cells TxP so as not to overlap the driving cells TxP, and a plurality of sensing patterns RxB electrically connecting the sensing cells RxP.

The driving cells TxP and the sensing cells RxP may be formed of a transparent conductive material, such as any of an indium tin oxide (ITO), a carbon nano tube (CNT), and graphene, for example.

Further, the driving cells TxP and the sensing cells RxP may be formed of any of the aforementioned transparent conductive materials or a metal material.

Driving lines DL may be connected between the driving cells TxP and pad electrodes PDs1, and sensing lines SL may be connected between the sensing cells RxP and the pad electrodes PDs1.

According to an exemplary embodiment, each of the driving lines DL and the sensing lines SL may be formed of a transparent conductive material, but is not limited thereto, and may be formed of a low resistance material, such as molybdenum (Mo), silver (Ag), titanium (Ti), copper (Cu), aluminum (Al), or molybdenum/aluminum/molybdenum (Mo/Al/Mo), for example.

Further, the pad electrodes PDs1 may be connected with first pad electrodes PDs2a of the flexible printed circuit board FPC.

The driving lines DL and the sensing lines SL may be disposed in a non-active area positioned at an outer side of an active area, in which an image is displayed, but are not limited thereto.

Figure 9:
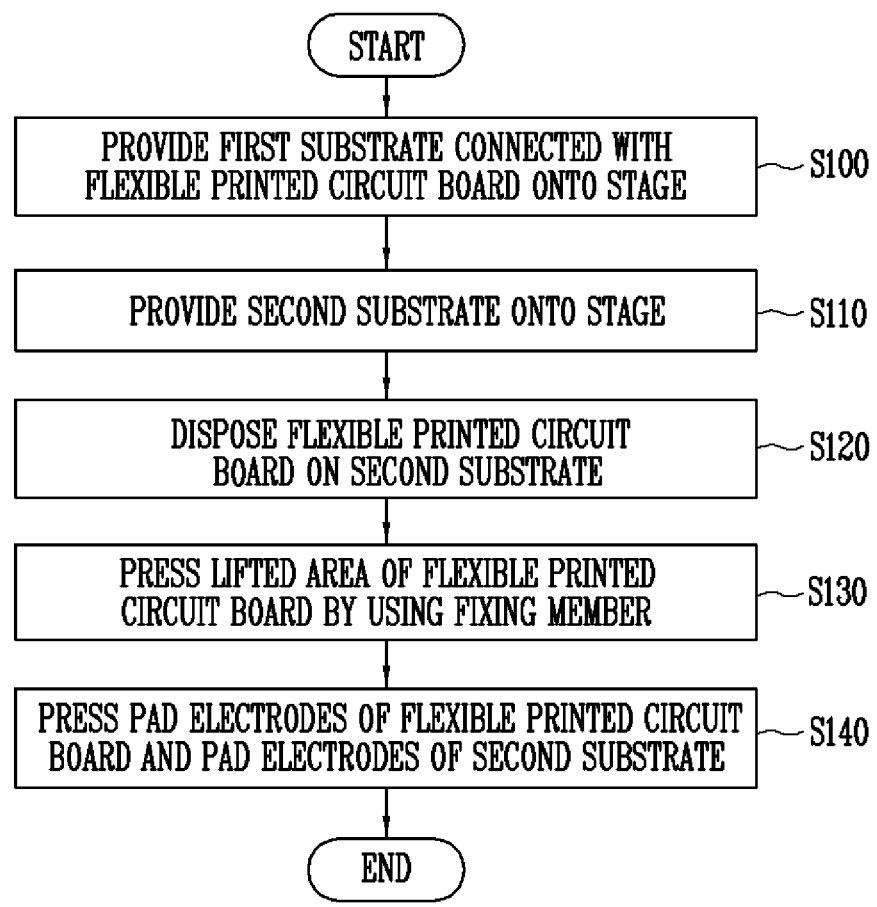
FIG. 9 is a flowchart for describing a pressing method of a press apparatus according to an exemplary embodiment of the present disclosure.

FIG. 9 is a flowchart for describing a pressing method of the press apparatus according to an exemplary embodiment of the present disclosure.

Referring to FIG. 9, the press apparatus 100 according to an exemplary embodiment of the present disclosure may provide a first substrate connected with a flexible printed circuit board onto a stage (S100), and provide a second substrate onto the stage (S110).

The press apparatus 100 may dispose the flexible printed circuit board FPC on the second substrate (S120).

The press apparatus 100 may press a lifted area AR of the flexible printed circuit board FPC by using the fixing member FM (S130), and may press a pad portion of the flexible printed circuit board FPC and a pad portion of the second substrate to each other (S140).

The present disclosure has been described with reference to some exemplary embodiments illustrated in the drawings, but the exemplary embodiments are only illustrative, and it is to be appreciated by those skilled in the art that various modifications and equivalent exemplary embodiments may be made. Accordingly, the actual scope of the present disclosure is to be determined by the spirit of the appended claims.

What is claimed is:

1. A pressing method operatively associated with a press apparatus, the method comprising:
   providing a first substrate connected with a flexible printed circuit board at a first connection portion of the flexible printed circuit board onto a first stage portion of the press apparatus;
   providing a second substrate onto a second stage portion of the press apparatus;
   arranging pad electrodes of the flexible printed circuit board on pad electrodes of the second substrate;
   firstly pressing a pad electrode-free area of the flexible printed circuit board, the pad electrode-free area being between the first connection portion of the flexible printed circuit board and the pad electrodes of the flexible printed circuit board; and
   subsequently to the firstly pressing of the pad electrode-free area, secondly pressing the pad electrodes of the flexible printed circuit board and the pad electrodes of the second substrate while pressing of the pad electrode-free area of the firstly pressing.

2. The pressing method of claim 1, wherein the pressing of the pad electrode-free area includes pressing the pad electrode-free area of the flexible printed circuit board by using a press jig of the press apparatus.

3. The pressing method of claim 2, wherein the pressing of the pad electrode-free area of the flexible printed circuit board by using the press jig includes:
   contacting the pad electrode-free area with the press jig; and
   shifting the press jig toward the first substrate.

4. The pressing method of claim 1, wherein the flexible printed circuit board is directly connected to the first substrate at the first connection portion of the flexible printed circuit board.

5. The pressing method of claim 1, wherein the pad electrodes of the flexible printed circuit board are second pad electrodes, and the first connection portion of the flexible printed circuit board comprises first pad electrodes.

6. A pressing method operatively associated with a press apparatus, the method comprising:
   providing a first substrate connected with a flexible printed circuit board onto a stage of the press apparatus;
   providing a second substrate onto the stage;

arranging the flexible printed circuit board on the second substrate;
pressing a pad electrode-free area of the flexible printed circuit board; and
pressing first pad electrodes of the flexible printed circuit board and second pad electrodes of the second substrate;
wherein the pressing of the pad electrode-free area includes:
passing a guide pin of the press apparatus through a first coupling hole formed in the flexible printed circuit board and a second coupling hole formed in the second substrate; and
pressing the pad electrode-free area by using the guide pin.

* * * * *